(12) United States Patent
Kim et al.

(10) Patent No.: US 7,733,162 B2
(45) Date of Patent: Jun. 8, 2010

(54) PLUMPING VOLTAGE GENERATING CIRCUIT

(75) Inventors: Jong-Sam Kim, Ichon (KR); Jong-Chern Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/327,729

(22) Filed: Dec. 3, 2008

(65) Prior Publication Data
US 2009/0231022 A1 Sep. 17, 2009

(30) Foreign Application Priority Data
Mar. 11, 2008 (KR) ...................... 10-2008-0022633

(51) Int. Cl.
*G05F 3/02* (2006.01)
(52) U.S. Cl. ........................................ 327/536; 363/60
(58) Field of Classification Search ................. 327/536; 363/59–60
See application file for complete search history.

(56) References Cited

U.S. PATENT DOCUMENTS

| | | | | |
|---|---|---|---|---|
| 5,952,872 A | * | 9/1999 | Hur | 327/535 |
| 5,982,222 A | * | 11/1999 | Kyung | 327/536 |
| 6,002,630 A | * | 12/1999 | Chuang et al. | 365/226 |
| 6,294,950 B1 | | 9/2001 | Lee et al. | |
| 6,492,862 B2 | * | 12/2002 | Nakahara | 327/536 |
| 7,224,207 B2 | * | 5/2007 | Chou et al. | 327/536 |
| 7,253,676 B2 | * | 8/2007 | Fukuda et al. | 327/536 |
| 7,348,829 B2 | * | 3/2008 | Choy et al. | 327/536 |
| 7,468,628 B2 | * | 12/2008 | Im et al. | 327/548 |
| 7,605,639 B2 | * | 10/2009 | Gou | 327/536 |
| 2007/0069804 A1 | * | 3/2007 | Kim et al. | 327/536 |
| 2008/0191786 A1 | * | 8/2008 | Kwon et al. | 327/536 |
| 2009/0091376 A1 | * | 4/2009 | Kim et al. | 327/536 |
| 2009/0140703 A1 | * | 6/2009 | Kwon | 323/222 |

FOREIGN PATENT DOCUMENTS

| | | |
|---|---|---|
| JP | 11154396 | 6/1999 |
| KR | 1020000041743 A | 7/2000 |
| KR | 2008-0000290 | 1/2008 |

* cited by examiner

*Primary Examiner*—Lincoln Donovan
*Assistant Examiner*—Thomas J Hiltunen
(74) *Attorney, Agent, or Firm*—Baker & McKenzie LLP

(57) ABSTRACT

A pumping voltage generating circuit of a semiconductor memory apparatus, the pumping voltage generating circuit includes a detecting unit configured to compare a level of a pumping voltage with a level of a reference voltage to generate a detection signal, an oscillating signal generator configured to sequentially generate a first oscillating signal and a second oscillating signal in response to the detection signal, and to elevate frequencies of the first and second oscillating signals when the second oscillating signal is generated, a first pump configured to perform a pumping operation in response to the first oscillating signal, and a second pump configured to perform a pumping operation in response to the second oscillating signal, wherein output terminals of the first pump and the second pump are commonly connected, and the pumping voltage is output at the output terminals of the first pump and the second pump.

20 Claims, 4 Drawing Sheets

PLUMPING VOLTAGE GENERATING CIRCUIT

CROSS-REFERENCES TO RELATED APPLICATION

The present application claims priority under 35 U.S.C. §119(a) to Korean application number 10-2008-0022633, filed on Mar. 11, 2008, in the Korean Intellectual Property Office, which is incorporated herein by reference in its entirety as set forth in full.

BACKGROUND

1. Technical Field

The embodiments described herein relate to a semiconductor integrated circuit (IC), and more particularly, to a pumping voltage generating circuit.

2. Related Art

In general, a dynamic random access memory (DRAM) device is capable of reading or writing data to a memory cell composed of a transistor and a capacitor. Since a DRAM device uses NMOS transistors comprising the memory cell, it includes a voltage pumping circuit for driving a word line to generate a potential at a level higher than the combined voltages of an external power supply voltage VDD and a threshold voltage Vt due to voltage losses due to the threshold voltage Vt.

For example, in order to drive an NMOS transistor in a DRAM memory cell, a voltage, which is higher than a source voltage by an amount equal to the threshold voltage Vt, should be applied to a gate of the NMOS transistor. However, since a maximum voltage applied to a DRAM memory cell generally has a voltage level of VDD, a boosted voltage, which is higher than VDD plus Vt, should be applied to a gate of the NMOS transistor in order to read a voltage having a complete level of VDD from a cell or a bit line, or to write to a cell or a bit line.

Various efforts have been made to reduce a consumption current in semiconductor devices. For example, in DRAM devices, consumption current can be reduced in a self-refresh mode. In general, a current is consumed to store data in a memory cell during a refresh operation. Here, a self-refresh current means the current measured during a self-refresh time. To reduce the self-refresh current, it is required to increase a self-refresh period. However, to increase the self-refresh period, it is required to increase a data retention time, which is a time for respective memory cells to retain data. One of method to increase the data retention time includes increasing a back bias voltage VBB applied to a transistor of the respective memory cells. For example, when in a self-refresh mode, a method includes reducing an off-leakage current of a cell transistor and increasing the data retention time by elevating and providing a back bias voltage VBB pumped and output from a voltage pumping device.

As a result, a high voltage VPP is mainly a voltage for driving a word line of a DRAM device, and a back bias voltage VBB is a voltage that is applied to a forming area in a transistor of a memory cell in order to reduce the self-refresh current. For example, both the high voltage VPP and the back bias voltage VBB are generated in a pumping voltage generating circuit equipped with an oscillator and a voltage pump.

FIG. 1 is a schematic block diagram of a conventional pumping voltage generating circuit. In FIG. 1, a pumping voltage generating circuit includes a detecting unit 10, an oscillator 20, a first VPP pump 30, and a second VPP pump 40. The detecting unit 10 generates a detection signal 'det' based upon a comparison of levels between a reference voltage Vref and a pumping voltage VPP. When the detection signal 'det' is enabled, the oscillator 20 outputs an oscillating signal 'osc'.

Both the first VPP pump 30 and the second VPP pump 40 receive the oscillating signal 'osc' as an input, and performs pumping operations. Here, the pumping voltage VPP is output from a common node (node A) to which the individual output terminals of the first and second VPP pumps 30 and 40 are connected.

However, the pumping voltage generating circuit is problematic in that a peak current increases instantaneously because the first and second VPP pumps 30 and 40 are driven at the same time.

SUMMARY

A pumping voltage generating circuit of a semiconductor memory apparatus capable of preventing an increase of a peak current is described herein.

In one aspect, a pumping voltage generating circuit of a semiconductor memory apparatus, the pumping voltage generating circuit includes a detecting unit configured to compare a level of a pumping voltage with a level of a reference voltage to generate a detection signal, an oscillating signal generator configured to sequentially generate a first oscillating signal and a second oscillating signal in response to the detection signal, and to elevate frequencies of the first and second oscillating signals when the second oscillating signal is generated, a first pump configured to perform a pumping operation in response to the first oscillating signal, and a second pump configured to perform a pumping operation in response to the second oscillating signal, wherein output terminals of the first pump and the second pump are commonly connected, and the pumping voltage is output at the output terminals of the first pump and the second pump.

In another aspect, a pumping voltage generating circuit of a semiconductor memory apparatus, the pumping voltage generating circuit includes a detecting unit configured to compare a level of a pumping voltage with a level of a reference voltage and to generate a detection signal, an oscillating signal generator configured to sequentially output a plurality of oscillating signals according to a length of an enable interval of the detection signal, and configured to elevate frequencies of the oscillating signals when a selected oscillating signal among the oscillating signals is output as a reference oscillating signal, and a plurality of pumps configured to receive the oscillating signals, respectively, and to perform pumping operations.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
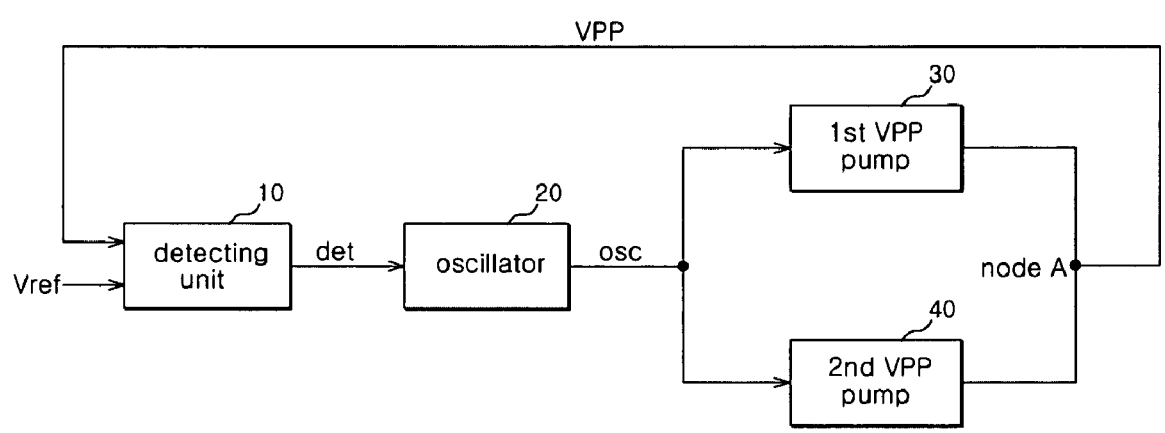
FIG. 1 is a schematic block diagram of a conventional pumping voltage generating circuit.
Figure 2:
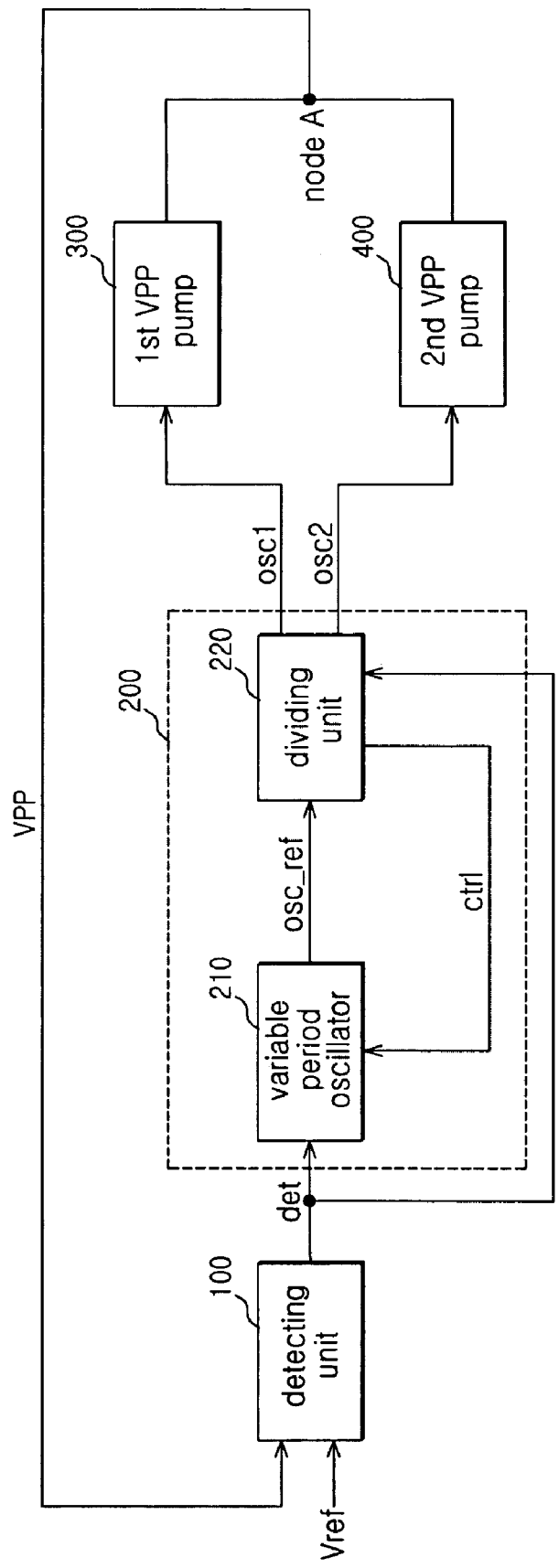
FIG. 2 is a schematic block diagram of an exemplary pumping voltage generating circuit capable of being implemented in a semiconductor memory apparatus according to one embodiment.

FIG. 2 is a schematic block diagram of an exemplary pumping voltage generating circuit capable of being implemented in a semiconductor memory apparatus according to one embodiment. In FIG. 2, a pumping voltage generating circuit of a semiconductor memory apparatus can be configured to include a detecting unit 100, an oscillating signal generator 200, a first VPP pump 300, and a second VPP pump 400.

The detecting unit 100 can generate a detection signal 'det' by comparing a level of a reference voltage Vref with that of a pumping voltage VPP.

The oscillating signal generator 200 can be configured to generate a first oscillating signal 'osc1' and a second oscillating signal 'osc2' when the detection signal 'det' is enabled. In addition, the oscillating signal generator 200 can be configured so that frequencies of the first and second oscillating signals 'osc1' and 'osc2' rise when the second oscillating signal 'osc2' is generated, wherein the second oscillating signal 'osc2' can be generated after the first oscillating signal 'osc1' is generated.

Furthermore, the oscillating signal generator 200 may include a variable period oscillator 210 and a dividing unit 220. The variable period oscillator 210 can generate a reference oscillating signal 'osc_ref' in response to the detection signal 'det' and a control signal 'ctrl'. For example, when the detection signal 'det' is enabled, the variable period oscillator 210 can generate the reference oscillating signal 'osc_ref'. Similarly, when the control signal 'ctrl' is enabled, the variable period oscillator 210 can generate the reference oscillating signal 'osc_ref' having higher frequency than when the control signal 'ctrl' is disabled.

The dividing unit 220 can be configured to sequentially delay the reference oscillating signal 'osc_ref' to output the first and second oscillating signals 'osc1' and 'osc2', wherein the control signal 'ctrl' can be enabled when the second oscillating signal 'osc2' is output. For example, when a predetermined period, i.e., one period, of the reference oscillating signal 'osc_ref' passes after the first oscillating signal 'osc1' is output, the second oscillating signal 'osc2' can be output.

In FIG. 2, the first VPP pump 300 can perform a pumping operation in response to the first oscillating signal 'osc1'. In addition, the second VPP pump 400 can perform a pumping operation in response to the second oscillating signal 'osc2'. When the frequencies of the first and second oscillating signals 'osc1' and 'osc2' increase, frequencies of the pumping operations in the first and second VPP pumps 300 and 400 can also increase. Here, the pumping voltage VPP can be output from a common node (node A) to which both the output terminal of the first VPP pump 300 and the output terminal of the second VPP pump 400 can be connected.

Figure 3:
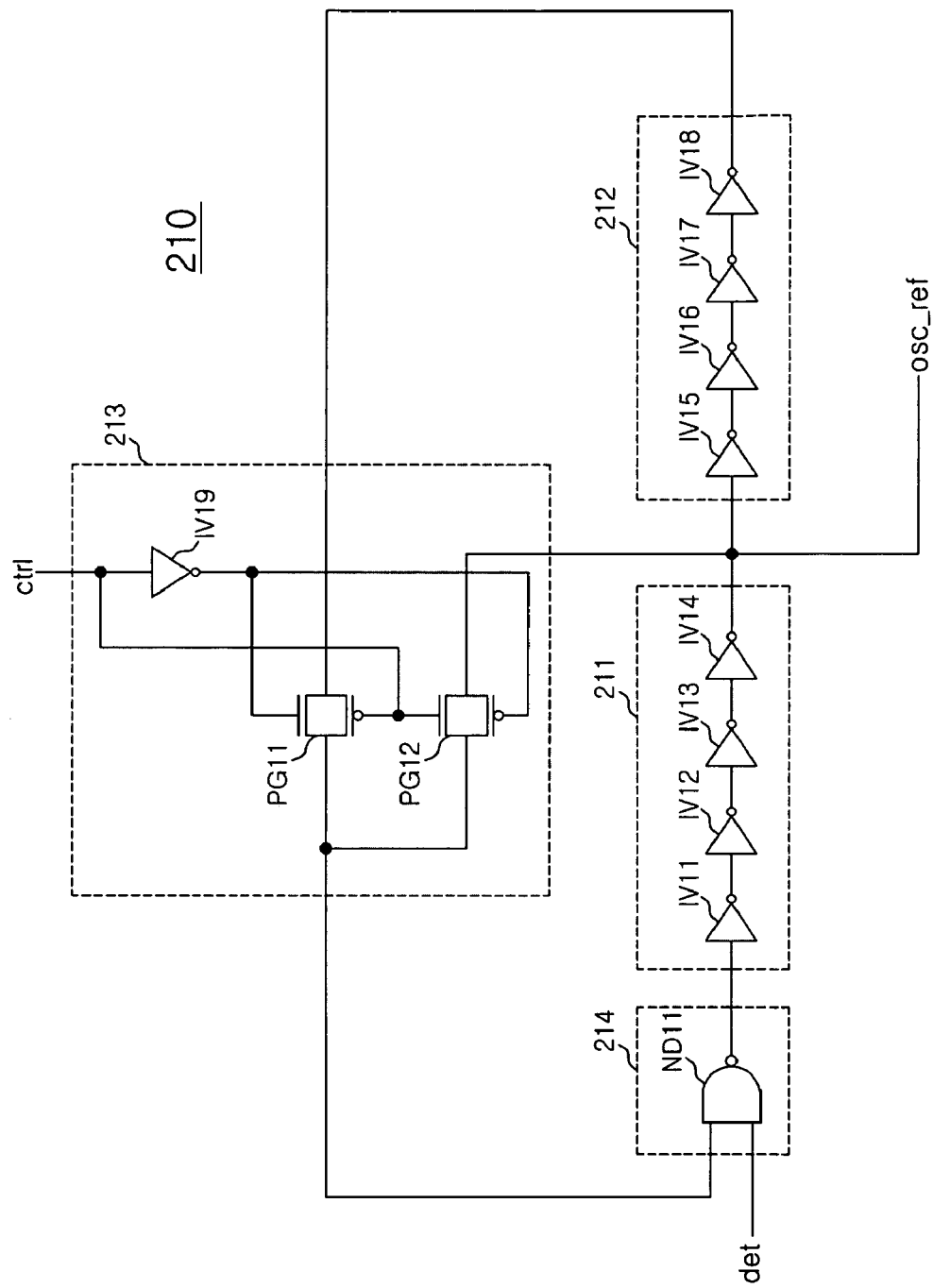
FIG. 3 is a schematic circuit diagram of an exemplary variable period oscillator capable of being implemented in the circuit of FIG. 2 according to one embodiment.

FIG. 3 is a schematic circuit diagram of an exemplary variable period oscillator capable of being implemented in the circuit of FIG. 2 according to one embodiment. In FIG. 3, a variable period oscillator 210 can be configured to include a first inverter chain 211, a second inverter chain 212, a selecting unit 213, and an oscillation controller 214.

The first inverter chain 211 can receive an output signal of the oscillation controller 214 as an input, and can output the output signal of the oscillation controller 214 to the second inverter chain 212 and the selecting unit 213. Here, the first inverter chain 211 can include an even number of inverters IV11 to IV14. For example, the first inverter chain 211 can include first to fourth inverters IV11 to IV14.

The second inverter chain 212 can receive an output signal of the first inverter chain 211 as an input, and can output the output signal of the first inverter chain 211 to the selecting unit 213. Here, the second inverter chain 212 can include and even number of inverters IV15 to IV18. For example, the second inverter chain 212 can include fifth to eighth inverters IV15 to IV18.

The selecting unit 213 can selectively provide either the output signal of the first inverter chain 211 or the output signal of the second inverter chain 212 to the oscillation controller 214 in response to the control signal 'ctrl'. For example, the selecting unit 213 can output the output signal of the first inverter chain 211 to the oscillation controller 214 when the control signal 'ctrl' is enabled to a high level, and can output the output signal of the second inverter chain 212 to the oscillation controller 214 when the control signal 'ctrl' is disabled to a low level.

In FIG. 3, the selecting unit 213 can include first and second pass gates PG11 and PG12, and a ninth inverter IV19. Here, the ninth inverter IV19 can receive the control signal 'ctrl' as an input. The first pass gate PG11 can receive the output signal of the ninth inverter IV19 at a first control terminal, and can receive the control signal 'ctrl' at a second control terminal. In addition, the first pass gate PG11 can output the output signal of the second inverter chain 212 to the oscillation controller 214. The second pass gate PG12 can receive the control signal 'ctrl' at a first control terminal, and can receive the output signal of the ninth inverter IV19 at a second control terminal. In addition, the second pass gate PG12 can output the output signal of the first inverter chain 211 to the oscillation controller 214.

The oscillation controller 214 can invert an output signal of the selecting unit 213 to output the inverted signal to the first inverter chain 211 in response to the detection signal 'det'. In addition, or otherwise, the oscillation controller 214 can output a signal having a specific level to the first inverter chain 211. For example, when the detection signal 'det' is enabled to a high level, the oscillation controller 214 can invert the output signal of the selecting unit 213 to output an inverted signal to the first inverter chain 211. Conversely, when the detection signal 'det' is disabled to a low level, the oscillation controller 214 can output only a signal having high level, regardless of the output signal of the selecting unit 213.

The oscillation controller 214 can include a NAND gate ND11. Here, the NAND gate ND11 can receive both the output signal of the selecting unit 213 and the detection signal 'det' as inputs.

Figure 4:
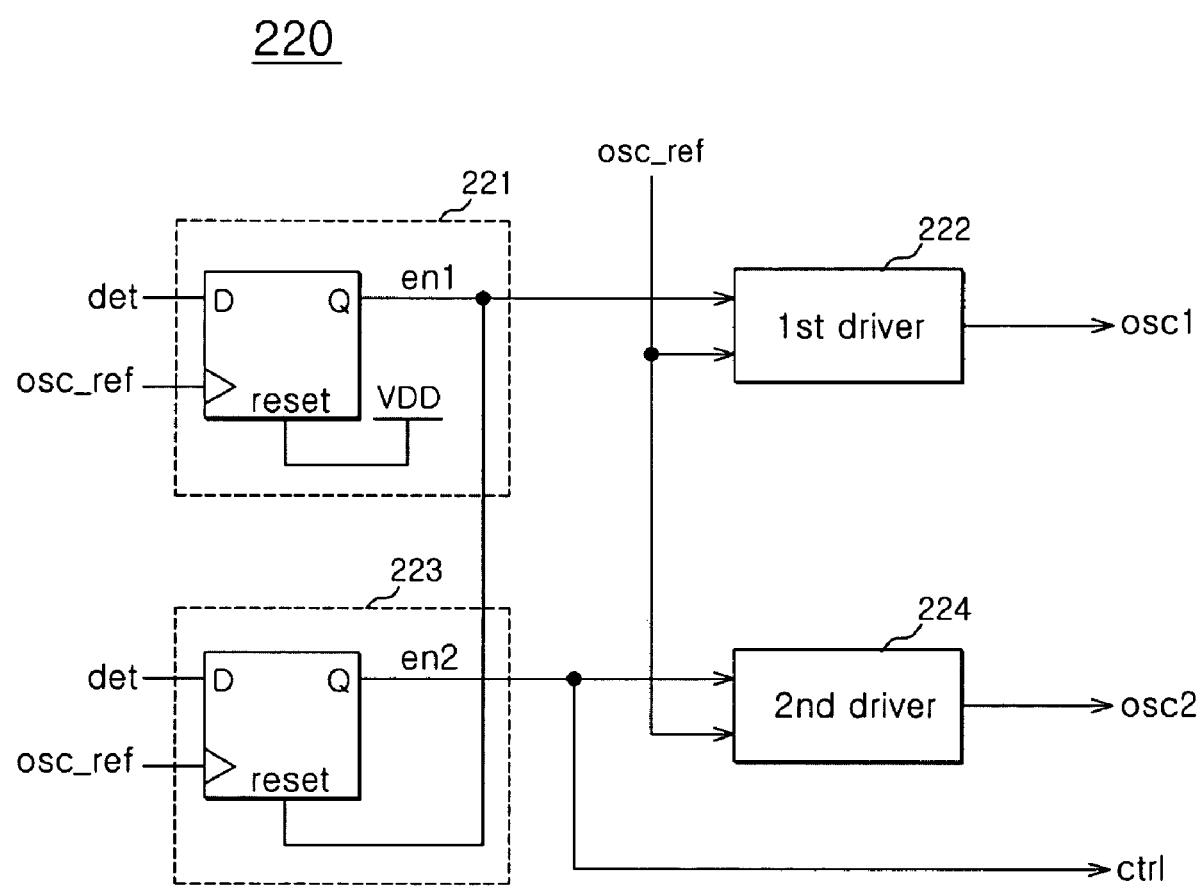
FIG. 4 is a schematic circuit diagram of an exemplary dividing unit capable of being implemented in the circuit of FIG. 2 according to one embodiment.

FIG. 4 is a schematic circuit diagram of an exemplary dividing unit capable of being implemented in the circuit of FIG. 2 according to one embodiment. In FIG. 4, a dividing unit 220 can be configured to include a first enable signal generator 221, a driver 222, a second enable signal generator 223, and a second driver 224.

The first enable signal generator 221 can synchronize the detection signal 'det' with the reference oscillating signal 'osc_ref', and can output a first enable signal 'en1'. For example, the first enable signal generator 221 can include a flip-flop having a signal input terminal D for receiving the detection signal 'det', a clock input terminal for receiving the reference oscillating 'signal osc_ref', and an output terminal Q to output the first enable signal 'en1'. Here, an external voltage VDD can be supplied to the reset terminal reset.

In FIG. 4, when the first enable signal 'en1' is enabled, the first driver 222 can output the reference oscillating signal 'osc_ref' as the first oscillating signal 'osc1'.

In addition, the second enable signal generator 223 can include a flip-flop having a signal input terminal D for receiving the detection signal 'det', a clock input terminal for receiving the reference oscillating signal 'osc_ref', and an output terminal Q to output the second enable signal 'en2'. Here, the second enable signal generator 223 can receive the first enable signal 'en1' as an input at the reset terminal reset. Accordingly, the detection signal 'det' can be synchronized with the reference oscillating signal 'osc_ref' to output the second enable signal 'en2' when the first enable signal 'en1' is enabled to a high level. Moreover, the second enable signal generator 223 can reset the level of the second enable signal 'en2' to a low level when the first enable signal 'en1' is disabled to a low level. Here, the second enable signal 'en2' can be output as the control signal 'ctrl'. Accordingly, when the second enable signal 'en2' is generated in response to the detection signal 'det', the enable timing of the second enable signal 'en2' can be later than that of the enable timing of the first enable signal 'en1', by as much as one time period of the reference oscillating signal 'osc_ref'.

An exemplary method of operation of a pumping voltage generating circuit of a semiconductor memory apparatus will now be described in detail with regard to FIGS. 2 and 3.

In FIG. 2, when the detection signal 'det' is enabled as a result of comparing the level of the reference voltage Vref with that of the pumping voltage VPP, the variable period oscillator 210 can generate the reference oscillating signal 'osc_ref'. Since the control signal 'ctrl' can be disabled to a low level at an initial state, the reference oscillating signal 'osc_ref' can be generated through a loop of the first inverter chain 211, the second inverter chain 212, and the oscillation controller 214 (in FIG. 3).

Then, the reference oscillating signal 'osc_ref' can be input to the first VPP pump 300 as a first oscillating signal 'osc1'. The first VPP pump 300 can perform a pumping operation in response to the first oscillating signal 'osc1' and can generate the pumping voltage VPP. When the pumping voltage VPP is higher than a target level, the detection signal 'det' can be disabled and the reference oscillating signal 'osc_ref' can not be generated. Thus, the first VPP pump 300 can not perform a pumping operation.

If the level of the pumping voltage VPP, which can be generated by only the first VPP pump 300, is lower than a target level, then the detecting unit 100 can enable the detection signal det continuously.

Next, the dividing unit 220 can output a second oscillating signal 'osc2' after a predetermined period of the first oscillating signal 'osc1', i.e., one time period, passes. When the second oscillating signal 'osc2' is output, the control signal 'ctrl' can be enabled to a high level.

Next, the second oscillating signal 'osc2' can be input to the second VPP pump 400, and then the second VPP pump 400, which receives the second oscillating signal 'osc2' as an input, can perform a pumping operation. Accordingly, both of the first and second VPP pumps 300 and 400 can perform pumping operations to generate the pumping voltage VPP.

In addition, when the control signal 'ctrl' is enabled to a high level, the variable period oscillator 210 can generate the reference oscillating signal 'osc_ref' having higher frequency than when the control signal 'ctrl' is disabled to a low level. In FIG. 3, when the control signal 'ctrl' is enabled to a high level, the reference oscillating signal 'osc_ref' can be generated through a loop of the first inverter chain 211 and the oscillation controller 214. Accordingly, when both of the first and second oscillating signals 'osc1' and 'osc2' are output, both of the first and second oscillating signals 'osc1' and 'osc2' can have higher frequencies than when only the first oscillating signal 'osc1' is output.

Here, when either of the first or second VPP pumps 300 or 400 receives an oscillating signal as an input having a high frequency for performing a pumping operation, the first or second VPP pumps 300 or 400 pump can have a higher pumping frequency than when receiving an oscillating signal having a low frequency as an input. As a result, when both of the first and second VPP pumps 300 and 400 perform pumping operations, the pumping frequencies of the respective first and second VPP pumps 300 and 400 can increase more than when only the first VPP pump 300 performs a pumping operation.

Accordingly, the exemplary pumping voltage generating circuit is capable of reducing a peak current by preventing simultaneous pumping operations of a plurality of VPP pumps. In addition, since the VPP pumps can be sequentially operated according to the level of the pumping voltage VPP, the exemplary pumping voltage generating circuit is capable of operating only a necessary and adequate number of VPP pumps. Thus, the exemplary pumping voltage generating circuit is able to reduce the amount of current consumption consumed for generating the pumping voltage VPP. Moreover, a current supply capability of the pumping voltage VPP can be improved by elevating the frequencies of the oscillating signals used for pumping operations according to the level of the pumping voltage VPP.

Although the dividing unit 220, as shown in FIG. 4, can include the first and second enable signal generators 221 and 223, and first and second drivers 222 and 224, the dividing unit 220 may also be configured to include a plurality of enable signal generators and a plurality of drivers. Here, by providing an output signal of the previous enable signal generator as an input to the next enable signal generator, the enable signal generators can be configured so that the enable signals output from individual enable signal generators can be sequentially output. The enable signals output sequentially therefrom can be input to the plurality of drivers so that a plurality of oscillating signals can be sequentially output.

The exemplary pumping voltage generating circuit of a semiconductor memory apparatus can reduce a peak current by preventing simultaneous operation of a plurality of voltage pumping circuits. Moreover, the exemplary pumping voltage generating circuit can reduce the amount of current consumption for generating pumping voltages by controlling the number of pumps performing pumping operations according to the amount of pumping voltage VPP used. In addition, when the number of voltage pumps performing pumping operations exceeds a predetermined number, the exemplary pumping voltage generating circuit can improve a current supply capability of a pumping voltage by means of elevating the frequencies of oscillating signals.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A pumping voltage generating circuit of a semiconductor memory apparatus, the pumping voltage generating circuit comprising:

a detecting unit configured to compare a level of a pumping voltage with a level of a reference voltage to generate a detection signal;

an oscillating signal generator configured to sequentially generate a first oscillating signal and a second oscillating signal in response to the detection signal, and to elevate frequencies of the first and second oscillating signals when the second oscillating signal is generated;

a first pump configured to perform a pumping operation in response to the first oscillating signal; and a second pump configured to perform a pumping operation in response to the second oscillating signal, wherein output terminals of the first pump and the second pump are commonly connected, and the pumping voltage is output at the output terminals of the first pump and the second pump.

2. The pumping voltage generating circuit of claim 1, wherein the oscillating signal generator includes:

a variable period oscillator configured to generate a reference oscillating signal in response to the detection signal and a control signal; and a dividing unit configured to sequentially delay the reference oscillating signal, to generate the first oscillating signal and the second oscillating signal, and to enable the control signal when the second oscillating signal is output.

3. The pumping voltage generating circuit of claim 2, wherein the variable period oscillator is configured to generate the reference oscillating signal when the detection signal is enabled.

4. The pumping voltage generating circuit of claim 3, wherein the reference oscillating signal has a higher frequency than when the control signal is disabled when the control signal is enabled.

5. The pumping voltage generating circuit of claim 4, wherein the variable period oscillator is configured as a ring oscillator to perform an oscillating operation, when the detection signal is enabled, and the variable period oscillator is configured to generate the reference oscillating signal through a shorter loop than when the control signal is disabled when the control signal is enabled.

6. The pumping voltage generating circuit of claim 5, wherein the variable period oscillator includes:

a first inverter chain;

a second inverter chain configured to receive an output signal of the first inverter chain as an input;

a selecting unit configured to selectively output one of the output signal of the first inverter chain and the output signal of the second inverter chain in response to the control signal; and an oscillation controller configured to invert the output signal of the selecting unit to output the inverted signal to the first inverter chain when the detection signal is enabled.

7. The pumping voltage generating circuit of claim 2, wherein the dividing unit is configured to output the reference oscillating signal as the first oscillating signal when the detection signal is enabled, to output the reference oscillating signal as the second oscillating signal after a predetermined time period of the reference oscillating signal, and to enable the control signal when the second oscillating signal is output.

8. The pumping voltage generating circuit of claim 2, wherein the dividing unit includes:

a first enable signal generator configured to synchronize the detection signal with the reference oscillating signal and to generate a first enable signal;

a first driver configured to output the reference oscillating signal as the first oscillating signal in response to the first enable signal;

a second enable signal generator configured to synchronize the detection signal with the reference oscillating signal in response to the first enable signal and to generate a second enable signal; and a second driver configured to output the reference oscillating signal as the second oscillating signal in response to the second enable signal, wherein the variable period oscillator outputs the second enable signal as the control signal.

9. The pumping voltage generating circuit of claim 8, wherein the first enable signal generator includes a first flip-flop having a signal input terminal for receiving the detection signal, a clock input terminal for receiving the reference oscillating signal, and a reset terminal for receiving a signal of a predetermined voltage level and to output the first enable signal.

10. The pumping voltage generating circuit of claim 9, wherein the second enable signal generator includes a second flip-flop having a signal input terminal for receiving the detection signal, a clock input terminal for receiving the reference oscillating signal, and a reset terminal for receiving the first enable signal and to output the second enable signal.

11. The pumping voltage generating circuit of claim 1, wherein the pumping voltage generating circuit drives a word line of the semiconductor memory apparatus.

12. A pumping voltage generating circuit of a semiconductor memory apparatus, the pumping voltage generating circuit comprising:

a detecting unit configured to compare a level of a pumping voltage with a level of a reference voltage and to generate a detection signal;

an oscillating signal generator configured to sequentially output a plurality of oscillating signals according to a length of an enable interval of the detection signal, and configured to elevate frequencies of the oscillating signals when a selected oscillating signal among the oscillating signals is output as a reference oscillating signal; and a plurality of pumps configured to receive the oscillating signals, respectively, and to perform pumping operations.

13. The pumping voltage generating circuit of claim 12, wherein the oscillating signal generator includes:

a variable period oscillator configured to output the reference oscillating signal in response to the detection signal and a control signal; and a dividing unit configured to sequentially delay the reference oscillating signal, to generate the oscillating signals, and to enable the control signal when a predetermined oscillating signal is output.

14. The pumping voltage generating circuit of claim 13, wherein the variable period oscillator is configured to perform an oscillating operation when the detection signal is enabled.

15. The pumping voltage generating circuit of claim 14, wherein the variable period oscillator is configured to generate the reference oscillating signal having a higher frequency than when the control signal is disabled when the control signal is enabled.

16. The pumping voltage generating circuit of claim 15, wherein the variable period oscillator is configured as a ring oscillator to perform an oscillating operation when the detection signal is enabled.

17. The pumping voltage generating circuit of claim 16, wherein the variable period oscillator is configured to generate the reference oscillating signal through a shorter loop than when the control signal is disabled when the control signal is enabled.

18. The pumping voltage generating circuit of claim 13, wherein the oscillating signals include the first oscillating signal and the second oscillating signal, and the dividing unit includes:
- a first enable signal generator configured to synchronize the detection signal with the reference oscillating signal and to generate a first enable signal;
- a first driver configured to output the reference oscillating signal as the first oscillating signal during an enable interval of the first enable signal;
- a second enable signal generator configured to synchronize the detection signal with the reference oscillating signal in response to the first enable signal and to generate a second enable signal; and
- a second driver configured to output the reference oscillating signal as the second oscillating signal during an enable interval of the second enable signal, wherein the second enable signal is the control signal.

19. The pumping voltage generating circuit of claim 12, wherein the selected oscillating signal is a last one of the plurality of oscillating signals that are sequentially output.

20. The pumping voltage generating circuit of claim 12, wherein the pumping voltage generating circuit drives a word line of the semiconductor memory apparatus.

* * * * *